(12) United States Patent
Peetermans et al.

(10) Patent No.: US 10,761,809 B1
(45) Date of Patent: Sep. 1, 2020

(54) RANDOM NUMBER GENERATOR

(71) Applicant: Katholieke Universiteit Leuven, Leuven (BE)

(72) Inventors: Adriaan Peetermans, Tessenderlo (BE); Vladimir Rozic, Leuven (BE); Ingrid Verbauwhede, Heverlee (BE)

(73) Assignee: KATHOLIEKE UNIVERSITEIT LEUVEN, Leuven (BE)

(\*) Notice: Subject to any disclaimer, the term of this patent is extended or adjusted under 35 U.S.C. 154(b) by 0 days.

(21) Appl. No.: 16/817,130

(22) Filed: Mar. 12, 2020

(51) Int. Cl.
*G06F 7/58* (2006.01)
*H03K 3/84* (2006.01)
*H03K 19/20* (2006.01)
*H03K 3/03* (2006.01)

(52) U.S. Cl.
CPC ............ *G06F 7/588* (2013.01); *H03K 3/84* (2013.01); *H03K 3/0315* (2013.01); *H03K 19/20* (2013.01)

(58) Field of Classification Search
CPC .................................. G06F 7/58; G06F 7/588
See application file for complete search history.

(56) References Cited

U.S. PATENT DOCUMENTS

| | | | |
|---|---|---|---|
| 8,990,276 B2 * | 3/2015 | Lazich | G06F 7/588 326/8 |
| 2003/0204743 A1 * | 10/2003 | Devadas | G06Q 20/3674 726/9 |
| 2006/0210082 A1 * | 9/2006 | Devadas | G06F 21/31 380/277 |
| 2009/0132624 A1 * | 5/2009 | Haselsteiner | H03K 3/84 708/255 |
| 2009/0172055 A1 * | 7/2009 | Radja | G06F 7/588 708/251 |

\* cited by examiner

*Primary Examiner* — Chuong D Ngo
(74) *Attorney, Agent, or Firm* — Workman Nydegger

(57) ABSTRACT

A random number generator includes an entropy source comprising a first digital device arranged to apply to an input signal a first delay value to obtain a first signal and a second digital device arranged to apply to the input signal a second delay value different from the first delay value to obtain a second signal; a sampling unit configured to sample one of the first and second signals using the other signal as reference clock, thereby obtaining a sampled signal; measurement means to perform measurements of the sampled signal's delay difference with respect to the reference clock; a controller circuit arranged to monitor the measured delay difference of the sampled signal and to check the values of the measured delay difference and, once a given condition related to the values is met, to output a configuration signal.

14 Claims, 4 Drawing Sheets

```
Controller Algorithm
    Input: meas[7:0], req
    Output: Select[2n-1:0], matched
    Global constant: L, H
1:  goodSamples[6:0] ← 0
2:  sampleCnt[6:0] ← 0
3:  Select[2n-1:0] ← 0
4:  matched ← 0
5:  while true do
6:      if req then
7:          if L ≤ meas[7:0] < H then
8:              goodSamples[6:0] ← goodSamples[6:0] + 1
9:              matched ← 1
10:         if sampleCnt[6:0] == 2⁷ − 1 then
11:             if goodSamples[6:0] == 0 then
12:                 Select[2n-1:0] ← Select[2n-1:0] + 1
13:                 matched ← 0
14:             goodSamples[6:0] ← 0
15:         sampleCnt[6:0] ← sampleCnt[6:0] + 1
```

Fig.6

RANDOM NUMBER GENERATOR

RESEARCH INFORMATION

The project leading to this application has received funding from the European Unions Horizon 2020 research and innovation programme Cathedral under grant agreement No695305 and the European Union's ERC Advanced Grant Cathedral project under grant agreement No. ERC-2015-AdG 698305.

FIELD OF THE INVENTION

The present invention is generally related to the field of random number generators, and in particular to hardware true random number generators.

BACKGROUND OF THE INVENTION

Random numbers find application in various fields. One important application domain is cryptography, where random numbers may be used in security systems to create secret keys, as parameters in a challenge-response protocol, padding values, masks and so on. Other application fields may be games (e.g. dice throw, card shuffling, roulette), signal and image processing, modelling of financial and scientific systems etc. A random number generator is used in such applications. True random numbers are generated from a physical noise source that acts as a source of randomness, are unpredictable and thus do not have periodicity.

Implementing True Random Number Generators (TRNGs) on reconfigurable hardware devices like e.g. Field-Programmable Gate Arrays (FPGAs) is challenging due to the limited TRNG specific resources and techniques available to the designer. Due to the availability of only digital resources in hardware devices like FPGAs, designs for such TRNGs are usually based on one of two possible noise generating processes, namely metastability of memory elements or timing jitter in free running oscillators. Although metastability has good stochastic properties, precise control is required on the timing of the events that lead to a metastable state. This requirement makes this type of TRNGs difficult to design and impractical for real-world applications.

Therefore TRNG designs tailored for implementation on a reconfigurable hardware device mostly make use of timing jitter as a source of entropy. However, also when adopting this approach, designers are confronted with substantial implementation challenges. The TRNG designer needs to deal with additional design constraints such as portability of the entropy source across e.g. different FPGA families and vendors, or even more importantly, reproducibility of the design across identical reconfigurable hardware devices. Process variations present in all deep sub-micrometer CMOS technologies ensure every manufactured device has unique characteristics. For jitter based TRNGs, these process variations express themselves primarily in terms of variations in the logic timing delay. In order to produce a minimum level of entropy density at the output, certain TRNG designs require these timing delay variations to be bounded to some maximal value. However, achieving low timing delay variability is non-trivial, as the designer has e.g. in FPGA implementations very limited control on the physical placement and routing of the primitives (i.e. the basic building blocks) that make up the TRNG circuitry.

TRNGs usually also require some manual setup or placement and routing constraints. For example, designs based on Self-Timed Ring oscillators (STRs) and delay chains require placement constraints that have to be set up for each FPGA family, thus limiting the portability of these designs. In addition, some entropy sources do not work correctly on all locations on an FPGA. Therefore, a search procedure is required for each individual device until a suitable placement is found.

In order to achieve good portability TRNG designs are thus preferably constructed by only using fundamental hardware primitives which are available in any reconfigurable hardware device. These designs should therefore preferably only require components like LookUp Tables (LUTs) and Flip-Flops (FFs) for logic and memory implementation, respectively. Designs are available that fulfil these constraints. One such design is the COherent Sampling ring Oscillator based TRNG (COSO-TRNG). COSO-TRNG implementations have been described which can achieve a throughput in the order of 1 Mbit/s, while requiring only minimal chip area. The entropy source of such a TRNG design consists of two identically designed ring oscillators (ROs) which generate two oscillating signals with similar periods. Due to process and interconnect delay variations, however, it is very challenging to match the periods of the two ROs in a reconfigurable device like an FPGA. For this reason, a search procedure has to be applied until by chance two well matched ROs are found. This high effort renders state of the art COSO-TRNG implementations unpractical as this procedure has to be repeated for every device, even from a same FPGA family.

Hence, there is a need for a random number generator wherein only basic building blocks are employed to ensure good portability and reproducibility.

SUMMARY OF THE INVENTION

It is an object of embodiments of the present invention to provide for a true random number generator comprising an entropy source that allows for a substantial reduction of the design effort of the generator.

The above objective is accomplished by the solution according to the present invention.

In a first aspect the invention relates to a random number generator comprising
an entropy source comprising a first digital device arranged to apply to an input signal a first delay value to obtain a first signal and a second digital device arranged to apply to said input signal a second delay value independent from said first delay value to obtain a second signal,
a sampling unit configured to sample one of said first and said second signals using the other signal as reference clock, thereby obtaining a sampled signal,
measurement means to perform measurements of said sampled signal's delay difference with respect to said reference clock,
a controller circuit arranged to monitor said measured delay difference of said sampled signal and to check the values of said measured delay difference and, once a given condition related to said values is met, to output a configuration signal,
wherein said first and said second digital device each comprise a plurality of consecutive stages, each stage contributing to generate said first and said second signal with said first and said second delay, respectively, whereby in each digital device there is at least a stage with at least two parallel multiplexing means, an output stage comprising a multiplexing means to output said first and said second signal, respectively, said first and said second signal being a signal output by said at least two parallel multiplexing means of the respective preceding stage, and a stage with at least two enable circuits in parallel, said enable circuits being arranged to receive an external enabling signal and said input signal and to forward said input signal to at least said stage with said at least two multiplexing means, each of said at least two multiplexing means being connected to each of said at least two enable circuits and arranged to receive from said controller circuit said configuration signal to select an incoming signal from a preceding stage.

The proposed solution indeed allows for a considerable reduction of the design effort, as the controller circuit now steers the search to obtain a 'good' matching between the two digital devices. The controller circuit monitors the matching of the digital devices and checks the monitored delay difference values, for example to see if they are still between preset boundaries. Once a given condition is met, e.g. a given number of consecutive values of the sampled signal's delay difference compared to the reference clock signal falling outside the preset boundaries is found, the controller circuit sends a configuration signal to at least one of the digital devices in the entropy source to change the applied configuration, i.e. to activate other available paths through the multiplexer structure of the digital device. The least significant bit of the measured value of the period length can then be used for deriving a random number.

In a preferred embodiment at least one of the first and the second digital devices comprises one or more further stages with each at least two parallel multiplexing means, whereby said at least two multiplexing means each are connected to the at least two multiplexing means of a preceding stage. Preferably both the first and the second digital device comprise one or more further stages.

In embodiments of the invention the first and the second digital device are oscillators and the first and the second signal have a different frequency. Advantageously the oscillators are ring oscillators.

In preferred embodiments the configuration signal is applied to a plurality of multiplexing means of the at least one stage with at least two parallel multiplexing means.

In another embodiment the given condition related to the values is a given number of consecutively obtained values falling outside the predefined range.

In one embodiment the sampling unit comprises a data flip-flop.

In a preferred embodiment the enable circuit comprises a logic NAND gate.

In one embodiment the multiplexing means comprise a combinatorial logic circuit.

In an embodiment the controller is adapted to check whether said values of said measured delay difference are within a predefined range.

In some embodiments the random number generator as previously described is implemented in a reconfigurable hardware device. Advantageously, the reconfigurable hardware device is a field programmable gate array.

In other embodiments the random number generator as previously described is implemented as an application specific integrated circuit.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

FIG. 6 illustrates in simplified pseudo-code a possible implementation of the algorithm running in the controller.

DETAILED DESCRIPTION OF ILLUSTRATIVE EMBODIMENTS

Figure 1:
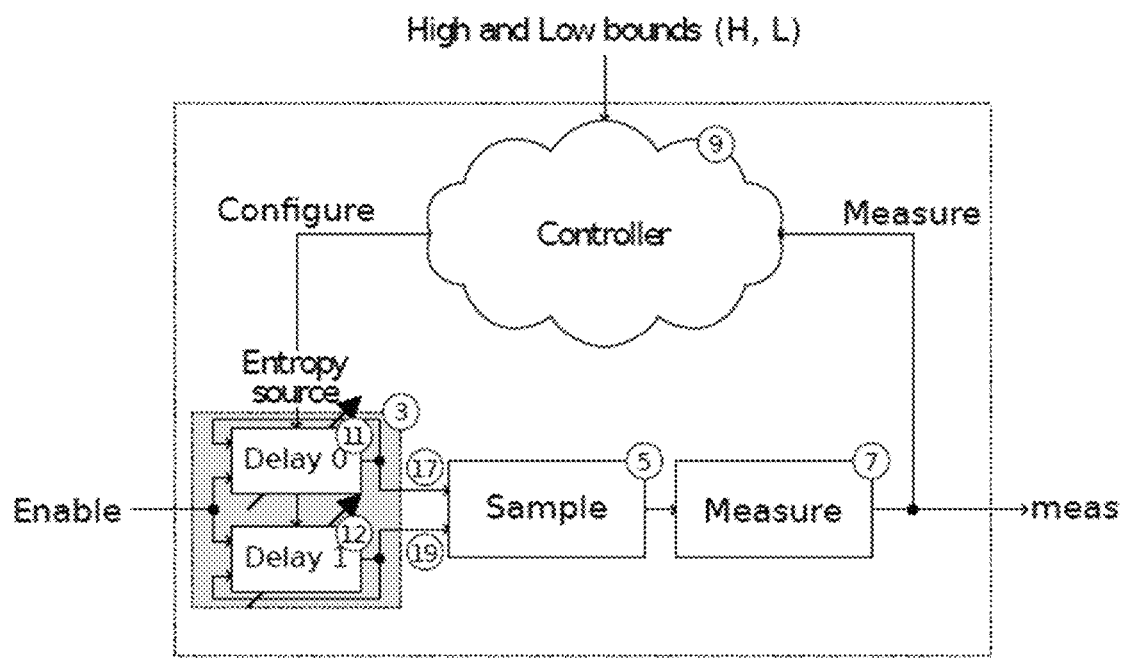
FIG. 1 illustrates a high level block scheme of a random number generator according to the present invention.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention proposes a true random number generator wherein in particular the entropy source design offers various interesting benefits. It enables an easy integration of the entropy source into complex systems. It further allows for performing automatic placement on reconfigurable hardware devices and it can readily be ported from one reconfigurable hardware device family to another. It also can be applied in an ASIC implementation of a random number generator.

A high level scheme of a random number generator (1) according to the present invention is illustrated in FIG. 1. A source of entropy (3) is provided which outputs a first (17) and a second (19) signal. In the design of the entropy source the dynamic timing delay variability of the two output signals is exploited to achieve true randomness. The entropy source comprises two digital devices (11,12) which each generate one of the signals output by the entropy source. In an embodiment the digital devices are implemented as digital delay lines. Each digital device receives a signal edge, e.g. an input clock signal, which is in the delay line subsequently delayed over a certain amount of time (which can also be expressed as a corresponding number (integer or not) of samples). However, due to non-deterministic jitter present in the clock signal and in the digital delay line, the signals output by each of the digital devices have a non-deterministic delay.

Figure 2:
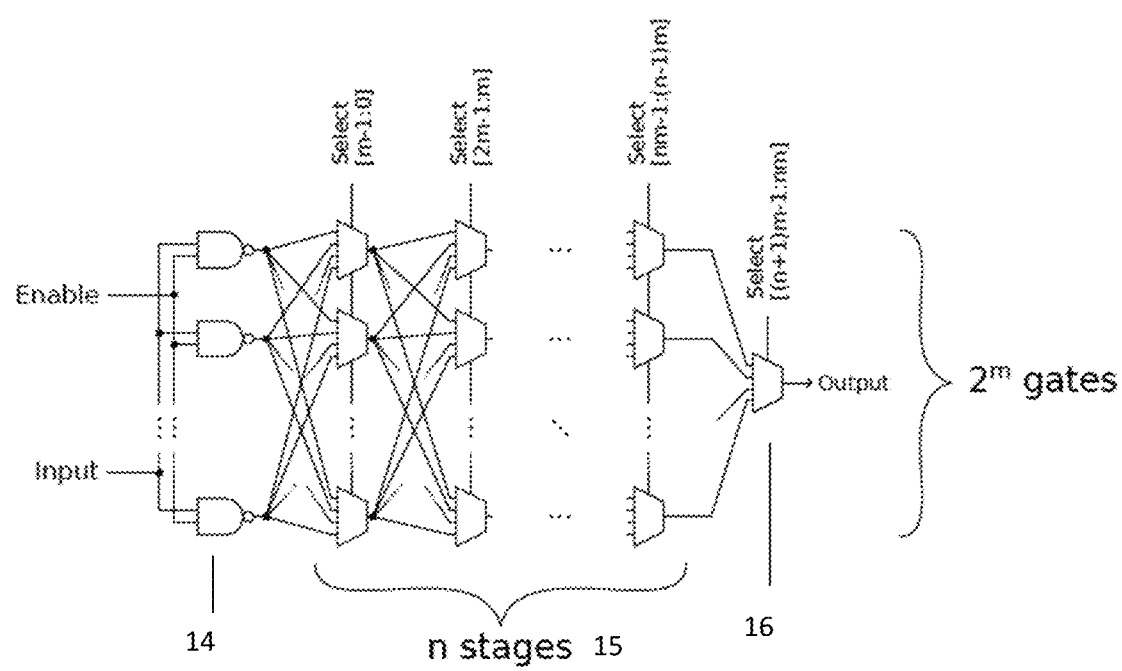
FIG. 2 illustrates an embodiment of a digital device comprised in the entropy source.

FIG. 2 illustrates an embodiment of a digital device of the entropy source. The configurable digital device is built up using a number of consecutive stages. In a minimum setup the device comprises three stages, namely a stage (14) with a plurality of enable circuits followed by a stage (15) comprising a plurality of multiplexing means and an output stage (16) with a multiplexing means that selects one of the signals output by the multiplexers of the preceding stage as resulting output signal of the digital device. In preferred embodiments there are several stages comprising a plurality of multiplexing means. Except for the final stage (16), each stage of the digital device comprises a plurality of blocks in parallel (i.e. enable circuits in the enabling stage and multiplexing means in the multiplexing stage(s)). Each enable circuit is at its output connected to an input of the various multiplexing means of the subsequent stage. Each multiplexing means in a given stage is at its input connected to the different multiplexer outputs (or enable circuit outputs) of the preceding stage. In preferred embodiments the multiplexing means is implemented as a combinatorial logic circuit.

In the illustrative example shown in FIG. 2 each stage contains a plurality of parallel blocks, e.g. four blocks. There are n stages (15) of multiplexing means with a plurality of parallel multiplexing components, hence together with the stage (14) of enable circuits and the output stage (16) with one multiplexing means one has n+2 stages in total. As already mentioned the minimum value of n equals 1. An exemplary topology with e.g. four parallel blocks enables $4^{n+1}$ possible paths through the structure of multiplexing stages in a single digital device of the entropy source. Each delay line element introduces some additional jitter. In this way each path results in a signal with a slightly different amount of delay due to variability caused by jitter. As there are two such digital devices in the entropy source having an architecture as in FIG. 2, there are in total $(4^n-4)^2$ combinations possible. Hence, in a general case with $2^n$ blocks in parallel there are $(2^{m(n+1)})^2$ possible paths.

In a more general case the input to the different multiplexers in the same stage do not need to be connected to the same configuration signal. Each of the $2^m$ enable gates can get a different input and each of the $2^m$ outputs from the last multiplexing stage can be outputted by the output stage (not shown). This leads to the scheme shown in FIG. 3. This configuration enables for $2^{nm2^m}$ unique configurations, of which $2^m$ unique delay lines can be constructed.

Figure 4A:
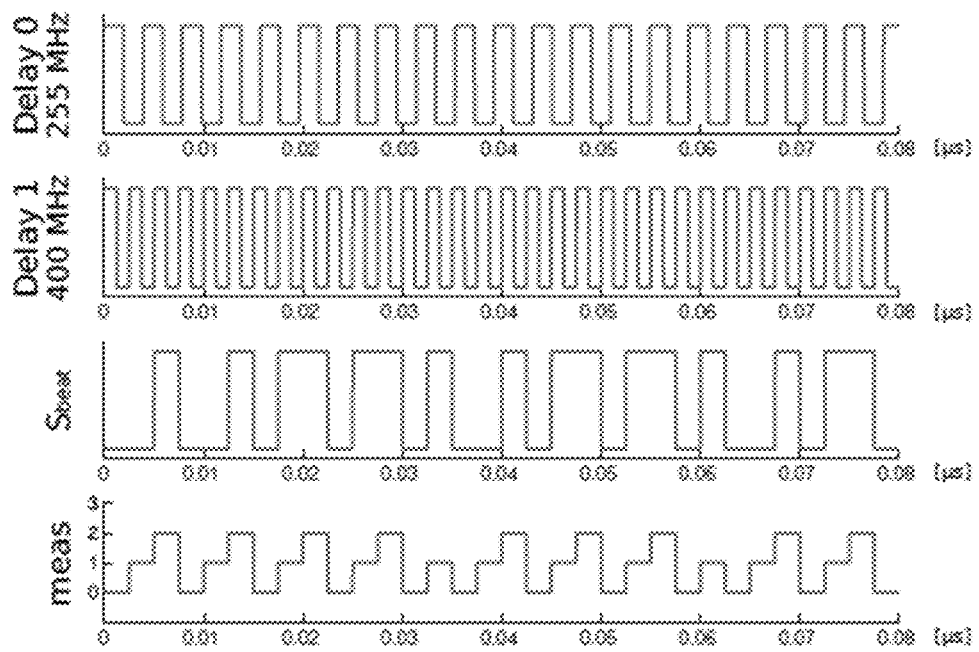
FIGS. 4A and 4B illustrate the need for matched digital devices. In the upper graph the matching is poor, whereas in the lower graph there is good matching, leading to a longer period length.
Figure 4B:
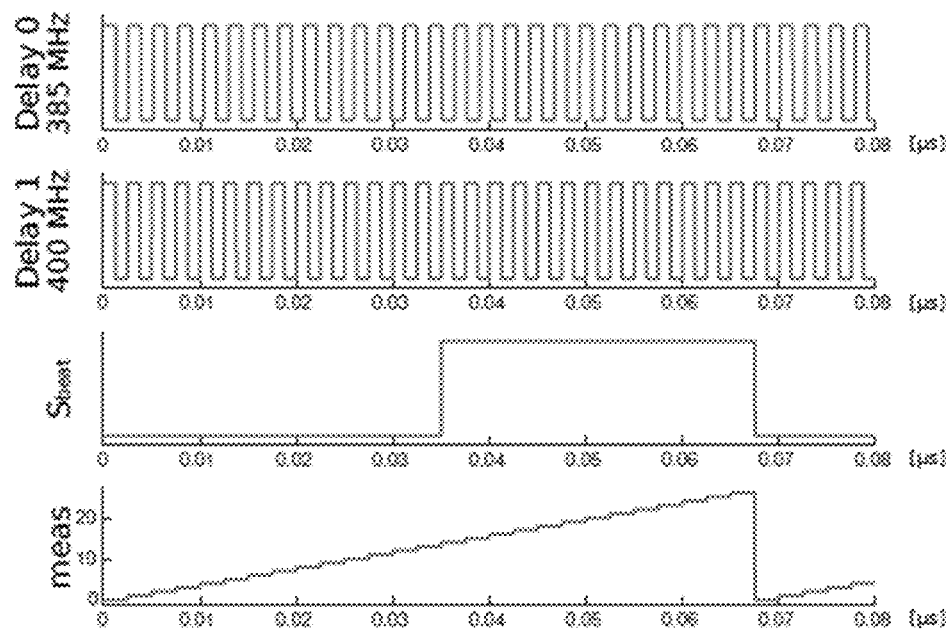

To explain how the entropy source can be configured, the rest of the high level scheme of FIG. 1 needs to be discussed first. In a sampling unit (5) one of the delayed clock signals output by the entropy source is sampled using the other delayed clock signal as a reference clock. This is illustrated in FIG. 4. The resulting sampled signal is a low frequency signal. The delay difference of the sampled signal with respect to the reference clock signal is measured by measurement means (7). The outcome of the measurement means, i.e. the measured delay difference, is a discrete random variable due to the independent random jitter in the two digital devices of the entropy source. In some embodiments the measurement means is a counter using the same clock signal used by the sampling unit. The obtained discrete random variable should have a variance as high as possible. On the other hand, the variance should not be too high as this negatively affects the throughput. The least significant bit of the measured period length can then be used to generate random data. FIG. 4 shows in the upper graphs a scenario with unmatched devices and in the bottom graphs with closely matched devices. In the example of FIG. 4A the signals have a frequency of 255 MHz and 400 MHz, respectively, the sampled signal still has a relatively high frequency and measured values are small. In FIG. 4B, on the contrary, the frequency of the first signal has been increased to 385 MHz. It can readily be seen that due to the better matching the sampled signal ($S_{beat}$) has a lower frequency and the measured delay difference (period length) meas obtained by the measurement means is larger. However, as only one random bit will be output per period of the sampled signal, the throughput decreases due to the better matching. Hence, throughput is traded off for entropy and a balance between those two quantities must be found.

The delay difference of the sampled signal w.r.t. the reference clock signal can also be seen as a change in the period length of the sampled signal over the measurements. So, in the description below the quantity meas can be interpreted also as period length instead of as delay difference.

In order to obtain a high enough variance it is required to have matched digital devices, hence the ratio of their delay timing values should be accurately controllable. An example is hereby provided. Matching the devices yields an increased period length of the measured signal meas and hence also the measured value will be higher. The mean and variance of the random variable meas can be expressed as:

$$E[meas] = \frac{E[T_{dev0}]}{E[\Delta]}$$

$$\text{Var}[meas] = E[meas]\frac{\text{Var}[\Delta]}{E[\Delta]^2}$$

where $T_{dev0}$ and $T_{dev1}$ denote the period lengths of the signals coming out of the entropy source. The mean and variance of the period difference $\Delta$ between those two signals are given by $$E[\Delta]=|E[T_{dev1}]-E[T_{dev0}]|$$

$$\text{Var}[\Delta]=\text{Var}[T_{dev0}]+\text{Var}[T_{dev1}]$$

To calculate the entropy per generated bit it is required to know the statistical distribution of the signal coming out of the measurement means. To calculate this distribution the sampled signal's average period length $E[T_{dev0}]$, the average period length difference $E[\Delta]$ and the jitter strength $\text{Var}[T_{dev0}]/E[T_{dev0}]$ are used as variables. The random variables $T_{dev0}$ and $T_{dev1}$ are thereby assumed to be independent and Gaussian distributed. Further the variance of both signals can be assumed equal ($\text{Var}[T_{dev0}]=\text{Var}[T_{dev1}]$), because they are implemented in the same technology (they have the same jitter strength) and the period difference $E[\Delta]$ is small. From the calculated distribution the probability of a zero/one ($p_0/p_1$) can be estimated as $$p_i = \sum_{j=0}^{\infty} Pr(meas = 2j + i), \text{ with } i = 0 \text{ or } 1$$

The min-entropy is then calculated as $$H_\infty = -\log_2\left(\max_{i\in\{0,1\}} p_i\right)$$

The throughput T is then equal to:

$$T = \frac{1}{E[meas]\cdot E[T_{dev1}]}$$

Figure 5:
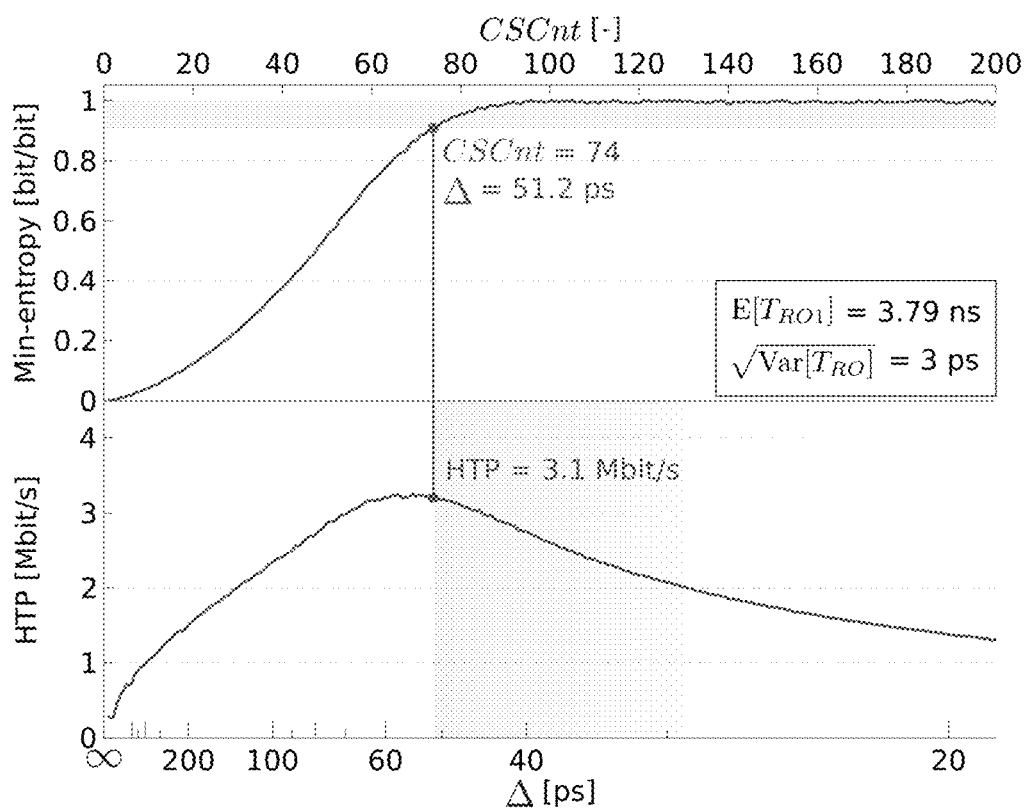
FIG. 5 illustrates an example of the minimum entropy curve and HTP curve vs the timing delay $\Delta$.

As already indicated throughput is traded off for entropy when the two digital devices get closely matched. The minimum entropy—throughput product (HTP) can therefore be used as measure to find a good entropy/throughput pair. The above equations allow estimating the HTP. FIG. 5 provides an illustration. The curve at the top depicts the min-entropy. This min-entropy should be higher than 0.91 according to the AIS 31 standard for TRNGs. The region that complies is shaded in the figure. The point with minimal period length value that meets this requirement is indicated by the vertical line and all values of the measured period length or, in the bottom curve, period difference $\Delta$ to the right of it give configurations that comply with the AIS-31 standard. However, as is also reflected in the bottom figure, configurations further to the right have reduced throughput and are therefore less desired. To maximise throughput, a configuration close to the vertical line is desirable, preferably as close as possible. For certain values of $E[\Delta]$ the HTP curve in FIG. 5 the maximum HTP value is reached, which indicates the best trade-off between on the one hand long accumulation time to provide sufficient entropy and on the other hand keeping the throughput high. The US NIST 800-90B standard does not define a strict bound on produced min-entropy, as the AIS-31 standard does. The min-entropy bound then rather depends on the post-processing used by the application. The solution according to the invention provides a flexible adjustment of this bound by altering the controller inputs L and H.

The controller (9), as shown in FIG. 1, monitors the signal meas output by the measurement means. The measured values are checked, for example to see whether the values fall in the range within predefined boundaries L and H. The lower bound L may for example be taken to be a value corresponding to the above-mentioned minimum entropy value of 0.91 set by the AIS-31 standard. The upper bound H may be determined by a minimal throughput requirement of the envisaged application. In case this is true, the same configuration of the digital devices in the entropy source is maintained. In the other case, i.e. when no value in the range between L and H is found, a counter is incremented that counts the number of outlying values. If a series of consecutive outlying values is found of a given length, then the controller selects an updated configuration and corresponding selection signals are sent to the various multiplexers of the two digital devices, or to at least one of the digital devices in case only one of the devices configuration settings need to be adapted.

A simplified pseudo-code describing a possible embodiment of the algorithm run in the controller is depicted in FIG. 6. Obviously, other algorithms can be used to achieve the same purpose. The controller monitors if the measured signal is still within the range with predefined boundaries L and H and selects a new multiplexer combination (Select) if necessary. The E[meas] is directly related to the matching of the two digital devices ($E[\Delta]$) via the already mentioned expression $E[meas]=E[T_{dev0}]/E[\Delta]$. In this particular example, the condition to change the configuration setting is assumed to be a series of given length of consecutive values outside the boundaries L and H. Hence, if a series of 127 consecutive 'bad' values is encountered, the controller selects a new configuration of the multiplexing means of the various stages. The controller sequentially goes through the possible configurations until a suitable one is found. Optimal boundaries L and H have to be chosen to maximise the throughput and provide sufficient entropy from FIG. 5. A smaller range [L;H) enables finer control, but increases the controller latency to find a suitable configuration.

In other implementations of the algorithm running in the controller the condition on which a new configuration signal is selected, can be more strict or less strict. A more critical application may demand a new configuration after a single value outside of the mentioned range has been observed. For other applications more values outside the predefined range may be tolerable. The procedure of selecting a new configuration can also be optimized. Instead of sequentially trying out all possible configurations, the controller can skip certain configurations that are predicted to produce unwanted matching, based on previously observed measurements.

The controller is activated at start-up to find a configuration that validates the stochastic model as describe above. After start-up, the controller remains actively checking the output values of the measurement means and dynamically recalibrates the digital devices when necessary. Hence, the present invention allows performing on the fly a cheap and simple test to check whether the produced values meet a predetermined condition, for example fall within the given entropy range.

Figure 3:
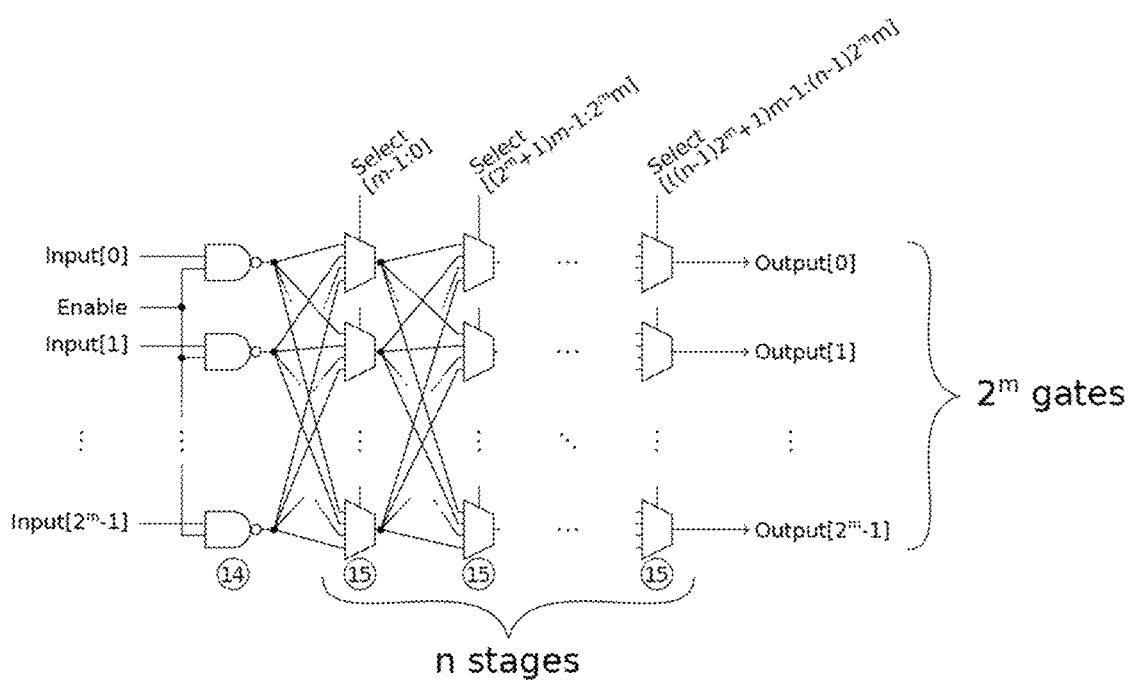
FIG. 3 illustrates an embodiment of a digital device comprised in the entropy source.

The configurable design of the entropy source in the random number generator as proposed in FIG. 2 or in FIG. 3 allows controlling the matching of the timing delay (period length) of the two digital devices with a precision e.g. in the order of picoseconds. The precision depends on the number of stages and gates in the digital devices. In a preferred embodiment the digital devices with delay line are implemented as oscillators. In a most preferred embodiment the digital devices are ring oscillators. Ring oscillators use a delay line formed from the gate delay of a cascade of logic gates.

In embodiments of the invention the sampling unit can be implemented as a data flip-flop. In other embodiments the sampling block can be implemented using a toggle flip-flop (TFF). In this case a Flip-Flop/latch is needed to be able to determine which signal was received first.

The controller can be implemented in various ways. In one embodiment the controller is realized as a finite state machine. In other embodiment the controller may be implemented e.g. on a microcontroller. In any case it must be made sure that the latency introduced by the controller is kept low.

In advantageous embodiments the enable circuits in the first stage of the digital device are implemented with NAND gates. One NAND gate input may be an external signal. In another embodiment the signal is not external but rather comes from the controller. The second input signal is a delay signal. In some embodiments this delay signal may come from an external controlling logic, for example from the application wherein the random number generator is used. In other embodiments the delay signal is fed back from the output from the last stage with a plurality of multiplexing means, for example in an implementation with ring oscillators as described below. In yet other embodiments the delay signal comes from the output of a similar device, for example in a transition effect ring oscillator design. In some embodiments the NAND gates are each implemented by one Look Up Table (LUT).

The measurement means for measuring the delay difference (period length) of the sampled signal can be a counter that receives the same clock signal used by the sampling unit. For example an 8-bit or a 16-bit asynchronous counter can be used. The counter is reset every time a new random bit is generated.

It is a design choice how many multiplexing stages are provided in the digital devices. More stages offer a greater number of possible configurations and increase the chance of finding sufficient matching. Experiments with some FPGA devices show that with only one or two multiplexing stages it may be difficult to obtain measured period lengths that fall within the shaded region of FIG. 5, i.e. the region where the min-entropy requirement is met. With three or more multiplexing stages many more measured values can be found in that region. Further the more multiplexing stages, the more area is consumed. Therefore, digital devices with three multiplexing stages may be most preferred for certain FPGA devices.

In some embodiments of the true random number generator of this invention the two digital devices in the entropy source have the same number of stages. This is advantageous in cases where a delay ratio close to one is desired. However, in other embodiments where a match for a ratio different from one is aimed at, the number of stages in the two digital devices is different.

A random number generator according to the present invention is preferably realised on a reconfigurable hardware device like an Field Programmable Gate Array (FPGA). The solution according to the invention offers the advantage that only basic building blocks like LUTs and flip-flops are needed to implement the random number generator. Therefore the solution is easily portable from one family of reconfigurable hardware devices to another.

Also the multiplexers can, in advantageous embodiments based on an FPGA, be implemented with LUTs. For example, in a case as illustrated in FIG. 2 or FIG. 3 and with four-input multiplexers, six-input LUTs can be used. In some embodiments the multiplexers may be realised as a combinatorial circuit.

In advantageous embodiments the FPGA based design makes use of ring oscillators. Examples of so obtained implementations are: a coherent Sampling ring Oscillator based TRNG (COSO-TRNG), an Elementary Ring Oscillator based TRNG (ERO-TRNG), a MUlti-Ring Oscillator based TRNG (MURO-TRNG), a Transition Effect Ring Oscillator based TRNG (TERO-TRNG), or a Self-Timed Ring based TRNG (STR-TRNG).

Moreover the proposed solution offers quite some flexibility in the global placement (i.e. the position with respect to other functional blocks in the system) of the random number generator on the chip, e.g. the FPGA. For various locations on the chip the digital devices of the entropy source can be matched. This is a substantial benefit compared to prior art solutions where a large design effort was needed to manually find an FPGA location with sufficient matching between the digital devices. This design effort, which had to be repeated for every device manufactured, becomes superfluous with the proposed random number generator.

One of the benefits of the proposed solution is that local placement constraints, i.e. the relative location and routing of individual components making up the entropy source, are not needed. This enables the proposed solution to be implemented together with the rest of the digital logic, making up the final application, using the standard digital design flow. This shields designers, who are not experts in the field of random number generation, from the implementation details that are commonly associated with the design of randomness generating circuits. This feature is in contrast with prior art solutions, where the circuit typically had been manually placed and routed to obtain the required matching results.

The true random number generator according to this invention does not necessarily need to be realized on a reconfigurable hardware device. In certain embodiments the device can be implemented on an ASIC. Both a full custom ASIC design and a standard cell ASIC design can be considered. In a full custom ASIC design the proposed circuit is fully digital and able to benefit from further CMOS scaling. This is in contrast to other solutions that may be more optimal in terms of area/energy.

In essence, the random number generator of this invention enables automatic delay matching (or frequency matching, which boils down to the same) of two digital devices implemented e.g. in the FPGA fabric. The on-chip controller algorithm sequentially tries out various configurations as described above, until it has found one that yields two closely matched digital devices in terms of timing delay. Due to the large number of configuration options, the path propagation delay can be controlled with a resolution down to a few picoseconds.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A random number generator comprising:
    an entropy source comprising a first digital device adapted to apply to an input signal a first delay value to obtain a first signal and a second digital device adapted to apply to said input signal a second delay value independent from said first delay value to obtain a second signal;
    a sampling unit configured to sample one of said first and said second signals using the other signal as reference clock, thereby obtaining a sampled signal;
    measurement means to perform measurements of said sampled signal's delay difference with respect to said reference clock;
    a controller circuit adapted to monitor said measured delay difference of said sampled signal and to output a configuration signal, once a given condition related to values of said measured delay difference is met;
    wherein said first and said second digital device each comprise a plurality of consecutive stages, each stage contributing to generate said first and said second signal with said first and said second delay, respectively, whereby in each digital device there is at least a stage with at least two parallel multiplexing means, an output stage comprising a multiplexing means to select a signal output by one of said at least two parallel multiplexing means of the preceding stage as said first or said second signal, respectively, and a stage with at least two enable circuits in parallel, said enable circuits being arranged to receive an enabling signal and said input signal and to forward said input signal to at least said stage with said at least two multiplexing means, each of said at least two multiplexing means being connected to each of said at least two enable circuits and arranged to receive from said controller circuit said configuration signal to select an incoming signal from a preceding stage.

2. The random number generator as in claim 1, wherein at least one of said first and said second digital devices comprises one or more further stages with each at least two parallel multiplexing means, whereby said at least two multiplexing means each are connected to the at least two multiplexing means of a preceding stage.

3. The random number generator as in claim 1, wherein said first and said second digital device are oscillators and said first and said second signal have a different frequency.

4. The random number generator as in claim 3, wherein said oscillators are ring oscillators.

5. The random number generator as in claim 1, wherein said configuration signal is applied to a plurality of multiplexing means of said at least one stage with at least two parallel multiplexing means.

6. The random number generator as in claim 1, wherein said given condition related to said values is a given number of consecutively obtained values falling outside said predefined range.

7. The random number generator as in claim 1, wherein said sampling unit comprises a data flip-flop.

8. The random number generator as in claim 1, wherein said enable circuit comprises a logic NAND gate.

9. The random number generator as in claim 1, wherein said measurement means is integrated in said controller circuit.

10. The random number generator as in claim 1, wherein said multiplexing means comprise a combinatorial logic circuit.

11. The random number generator as in claim 1, wherein said controller is adapted to check whether said values of said measured delay difference are within a predefined range.

12. The random number generator as in claim 1, implemented in a reconfigurable hardware device.

13. The random number generator as in claim 12, wherein said reconfigurable hardware device is a field programmable gate array.

14. The random number generator as in claim 1, implemented as an application specific integrated circuit.

* * * * *